(12) United States Patent  
Schafer

(10) Patent No.: US 9,576,633 B2  
(45) Date of Patent: Feb. 21, 2017

(54) METHOD AND SYSTEM FOR PROGRAMMING MAGNETIC JUNCTIONS UTILIZING HIGH FREQUENCY MAGNETIC OSCILLATIONS

(71) Applicant: Samsung Electronics Co., LTD., Gyeonggi-do (KR)

(72) Inventor: Sebastian Schafer, San Jose, CA (US)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 0 days.

(21) Appl. No.: 14/973,591

(22) Filed: Dec. 17, 2015

(65) Prior Publication Data

US 2016/0196859 A1    Jul. 7, 2016

Related U.S. Application Data

(60) Provisional application No. 62/099,856, filed on Jan. 5, 2015.

(51) Int. Cl.
  *G11C 11/00* (2006.01)
  *G11C 11/14* (2006.01)
  (Continued)

(52) U.S. Cl.
  CPC .......... *G11C 11/161* (2013.01); *G11C 11/1675* (2013.01); *H01L 43/10* (2013.01)

(58) Field of Classification Search
  USPC ........................................ 365/158, 171, 173
  See application file for complete search history.

(56) References Cited

U.S. PATENT DOCUMENTS 8,077,509 B2 * 12/2011 Yanagi .................. G11B 25/04
                                                    365/173
8,085,582 B2 * 12/2011 Nakamura ............... G11B 5/66
                                                    365/158

(Continued)

FOREIGN PATENT DOCUMENTS

WO    2012159078    11/2012
WO    2014025838    2/2014

OTHER PUBLICATIONS

C. D. Stanciu, et al., "All-optical magnetic recording with circularly polarized light," Physical Review Letters, Jul. 27, 2007.

*Primary Examiner* — Trong Phan

(74) *Attorney, Agent, or Firm* — Convergent Law Group LLP

(57) ABSTRACT

A magnetic memory and methods for providing and programming the magnetic memory are described. The memory includes storage cells, magnetic oscillator(s) and bit lines. Each storage cell includes magnetic junction(s) having a free layer, a reference layer, and a nonmagnetic spacer layer between reference and free layers. The free layer is switchable between stable magnetic states when a write current is passed through the magnetic junction. The free layer has a first magnetic anisotropy at room temperature and a second magnetic anisotropy at a minimum switching temperature due to at least the write current. The second magnetic anisotropy is not more than ninety percent of the first magnetic anisotropy. The first and second magnetic anisotropies correspond to first and second ferromagnetic resonance (FMR) frequencies. The magnetic oscillator(s) have a frequency range. The first FMR frequency is outside of the frequency range. The second FMR frequency is within the frequency range.

17 Claims, 5 Drawing Sheets

(51) Int. Cl.
    *G11C 11/15*       (2006.01)
    *G11C 11/16*       (2006.01)
    *H01L 43/10*       (2006.01)

(56) References Cited

U.S. PATENT DOCUMENTS

| | | | |
|---|---|---|---|
| 8,203,389 B1* | 6/2012 | Zhou | H03B 15/006 |
| | | | 365/158 |
| 8,274,811 B2* | 9/2012 | Zhang | G11B 5/3146 |
| | | | 365/158 |
| 8,467,235 B2* | 6/2013 | Slonczewski | B82Y 25/00 |
| | | | 365/158 |
| 8,717,812 B2 | 5/2014 | Mackay | |
| 9,017,831 B2* | 4/2015 | Nakada | H01F 10/3268 |
| | | | 365/158 |
| 2013/0148418 A1 | 6/2013 | Luo | |
| 2013/0229895 A1 | 9/2013 | Shiroishi | |
| 2014/0056060 A1 | 2/2014 | Khvalkovskiy | |
| 2014/0070344 A1 | 3/2014 | Khalili | |
| 2014/0071728 A1 | 3/2014 | Khalili | |
| 2014/0071732 A1 | 3/2014 | Khalili | |
| 2014/0124882 A1 | 5/2014 | Khalili | |

\* cited by examiner

Time ≤ t₁

Time ≥ t₄

METHOD AND SYSTEM FOR PROGRAMMING MAGNETIC JUNCTIONS UTILIZING HIGH FREQUENCY MAGNETIC OSCILLATIONS

CROSS-REFERENCE TO RELATED APPLICATIONS

This application claims the benefit of provisional Patent Application Ser. No. 62/099,856, filed Jan. 5, 2015, entitled THz ASSISTED STT-RAM, assigned to the assignee of the present application, and incorporated herein by reference.

BACKGROUND OF THE INVENTION

Magnetic memories, particularly magnetic random access memories (MRAMs), have drawn increasing interest due to their potential for high read/write speed, excellent endurance, non-volatility and low power consumption during operation. An MRAM can store information utilizing magnetic materials as an information recording medium. One type of MRAM is a spin transfer torque random access memory (STT-MRAM). STT-MRAM utilizes magnetic junctions written at least in part by a current driven through the magnetic junction. A spin polarized current driven through the magnetic junction exerts a spin torque on the magnetic moments in the magnetic junction. As a result, layer(s) having magnetic moments that are responsive to the spin torque may be switched to a desired state.

For example, FIG. 1 depicts a conventional magnetic tunneling junction (MTJ) 10 as it may be used in a conventional STT-MRAM. The conventional MTJ 10 typically resides on a substrate 12. A bottom contact 14 and top contact 22 may be used to drive current through the conventional MTJ 10. The conventional MTJ, uses conventional seed layer(s) (not shown), may include capping layers (not shown) and may include a conventional antiferromagnetic (AFM) layer (not shown). The conventional magnetic junction 10 includes a conventional pinned layer 16, a conventional tunneling barrier layer 18, and a conventional free layer 20. Also shown is top contact 22. Conventional contacts 14 and 22 are used in driving the current in a current-perpendicular-to-plane (CPP) direction, or along the z-axis as shown in FIG. 1. Typically, the conventional pinned layer 16 is closest to the substrate 12 of the layers 16, 18 and 20.

The conventional pinned layer 16 and the conventional free layer 20 are magnetic. The magnetization 17 of the conventional pinned layer 16 is fixed, or pinned, in a particular direction. Although depicted as a simple (single) layer, the conventional pinned layer 16 may include multiple layers. The conventional free layer 20 has a changeable magnetization 21. Although depicted as a simple layer, the conventional free layer 20 may also include multiple layers. The conventional pinned layer 16 and free layer 20 may have their magnetizations 17 and 21, respectively oriented perpendicular to the plane of the layers.

To switch the magnetization 21 of the conventional free layer 20, a current is driven perpendicular to plane (in the z-direction). When a sufficient current is driven from the top contact 22 to the bottom contact 14, the magnetization 21 of the conventional free layer 20 may switch to be parallel to the magnetization 17 of the conventional pinned layer 16. When a sufficient current is driven from the bottom contact 14 to the top contact 22, the magnetization 21 of the free layer may switch to be antiparallel to that of the pinned layer 16. The differences in magnetic configurations correspond to different magnetoresistances and thus different logical states (e.g. a logical "0" and a logical "1") of the conventional MTJ 10.

Because of their potential for use in a variety of applications, research in magnetic memories is ongoing. Mechanisms for improving the performance of STT-RAM are desired. For example, a high perpendicular magnetic anisotropy and a high magnetoresistance are desired. A high magnetic anisotropy in the conventional free layer 20 allows the magnetic moment 21 of the free layer to be thermally stable at higher temperatures. However, a high magnetic anisotropy also results in an increase in the current required to switch the direction of magnetization 21 of the free layer 20, particularly for shorter current pulse widths. Such an increase is undesirable. Shorter write times, and thus shorter current pulses, are also desired for faster memories. Thus, the use of a high magnetic anisotropy suffers from multiple drawbacks. Accordingly, what is needed is a method and system that may improve the performance of the spin transfer torque based memories. The method and system described herein address such a need.

BRIEF SUMMARY OF THE INVENTION

A magnetic memory including a magnetic junction and methods for providing and programming the magnetic junction are described. The memory includes magnetic storage cells, at least one magnetic oscillator and bit lines coupled with the magnetic storage cells. Each of the magnetic storage cells includes at least one magnetic junction having a free layer, a reference layer, and a nonmagnetic spacer layer between reference and free layers. The magnetic junction is configured such that the free layer is switchable between stable magnetic states when a write current is passed through the magnetic junction. The free layer has a first magnetic anisotropy at room temperature and a second magnetic anisotropy at a minimum switching temperature due to at least the write current. The second magnetic anisotropy is not more than ninety percent of the first magnetic anisotropy. The first magnetic anisotropy corresponds to a first ferromagnetic resonance (FMR) frequency. The second magnetic anisotropy corresponds to a second FMR frequency. The magnetic oscillator(s) have a characteristic frequency range. The first FMR frequency is outside of the characteristic frequency range. The second FMR frequency is within the characteristic frequency range. Thus, the magnetic junction is programmed by driving the write current through the magnetic junction in a write current pulse. While the write current is driven through the magnetic junction, an oscillating magnetic signal having the characteristic frequency range is provided. Thus, the free layer is programmed by excitation of an angle by the oscillating magnetic signal and spin transfer torque from the write current.

DETAILED DESCRIPTION OF THE INVENTION

Figure 1:
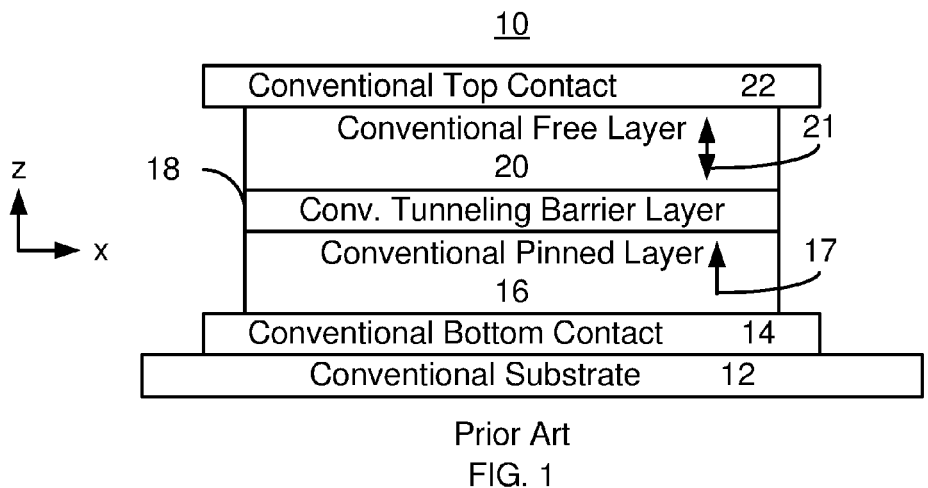
FIG. 1 depicts a conventional magnetic junction.

The exemplary embodiments relate to magnetic junctions usable in magnetic devices, such as magnetic memories, and the devices using such magnetic junctions. The magnetic memories may include spin transfer torque magnetic random access memories (STT-MRAMs) and may be used in electronic devices employing nonvolatile memory. Such electronic devices include but are not limited to cellular phones, smart phones, tables, laptops and other portable and non-portable computing devices. The following description is presented to enable one of ordinary skill in the art to make and use the invention and is provided in the context of a patent application and its requirements. Various modifications to the exemplary embodiments and the generic principles and features described herein will be readily apparent. The exemplary embodiments are mainly described in terms of particular methods and systems provided in particular implementations. However, the methods and systems will operate effectively in other implementations. Phrases such as "exemplary embodiment", "one embodiment" and "another embodiment" may refer to the same or different embodiments as well as to multiple embodiments. The embodiments will be described with respect to systems and/or devices having certain components. However, the systems and/or devices may include more or less components than those shown, and variations in the arrangement and type of the components may be made without departing from the scope of the invention. The exemplary embodiments will also be described in the context of particular methods having certain steps. However, the method and system operate effectively for other methods having different and/or additional steps, substeps and/or steps in different orders that are not inconsistent with the exemplary embodiments. Thus, the present invention is not intended to be limited to the embodiments shown, but is to be accorded the widest scope consistent with the principles and features described herein.

A magnetic memory including a magnetic junction and methods for providing and programming the magnetic junction are described. The memory includes magnetic storage cells, at least one magnetic oscillator and bit lines coupled with the magnetic storage cells. Each of the magnetic storage cells includes at least one magnetic junction having a free layer, a reference layer, and a nonmagnetic spacer layer between reference and free layers. The magnetic junction is configured such that the free layer is switchable between stable magnetic states when a write current is passed through the magnetic junction. The free layer has a first magnetic anisotropy at room temperature and a second magnetic anisotropy at a minimum switching temperature due to at least the write current. The second magnetic anisotropy is not more than ninety percent of the first magnetic anisotropy. The first magnetic anisotropy corresponds to a first ferromagnetic resonance (FMR) frequency. The second magnetic anisotropy corresponds to a second FMR frequency. The magnetic oscillator(s) have a characteristic frequency range. The first FMR frequency is outside of the characteristic frequency range. The second FMR frequency is within the characteristic frequency range. Thus, the magnetic junction is programmed by driving the write current through the magnetic junction in a write current pulse. While the write current is driven through the magnetic junction, an oscillating magnetic signal having the characteristic frequency range is provided. Thus, the free layer is programmed by excitation of an angle by the oscillating magnetic signal and spin transfer torque from the write current.

The exemplary embodiments are described in the context of particular methods, magnetic junctions and magnetic memories having certain components. One of ordinary skill in the art will readily recognize that the present invention is consistent with the use of magnetic junctions and magnetic memories having other and/or additional components and/or other features not inconsistent with the present invention. The method and system are also described in the context of current understanding of the spin transfer phenomenon, of magnetic anisotropy, and other physical phenomenon. Consequently, one of ordinary skill in the art will readily recognize that theoretical explanations of the behavior of the method and system are made based upon this current understanding of spin transfer, magnetic anisotropy and other physical phenomena. However, the method and system described herein are not dependent upon a particular physical explanation. One of ordinary skill in the art will also readily recognize that the method and system are described in the context of a structure having a particular relationship to the substrate. However, one of ordinary skill in the art will readily recognize that the method and system are consistent with other structures. In addition, the method and system are described in the context of certain layers being synthetic and/or simple. However, one of ordinary skill in the art will readily recognize that the layers could have another structure. Furthermore, the method and system are described in the context of magnetic junctions and/or substructures having particular layers. However, one of ordinary skill in the art will readily recognize that magnetic junctions and/or substructures having additional and/or different layers not inconsistent with the method and system could also be used. Moreover, certain components are described as being magnetic, ferromagnetic, and ferrimagnetic. As used herein, the term magnetic could include ferromagnetic, ferrimagnetic or like structures. Thus, as used herein, the term "magnetic" or "ferromagnetic" includes, but is not limited to ferromagnets and ferrimagnets. As used herein, "in-plane" is substantially within or parallel to the plane of one or more of the layers of a magnetic junction. Conversely, "perpendicular" and "perpendicular-to-plane" corresponds to a direction that is substantially perpendicular to one or more of the layers of the magnetic junction.

Figure 2:
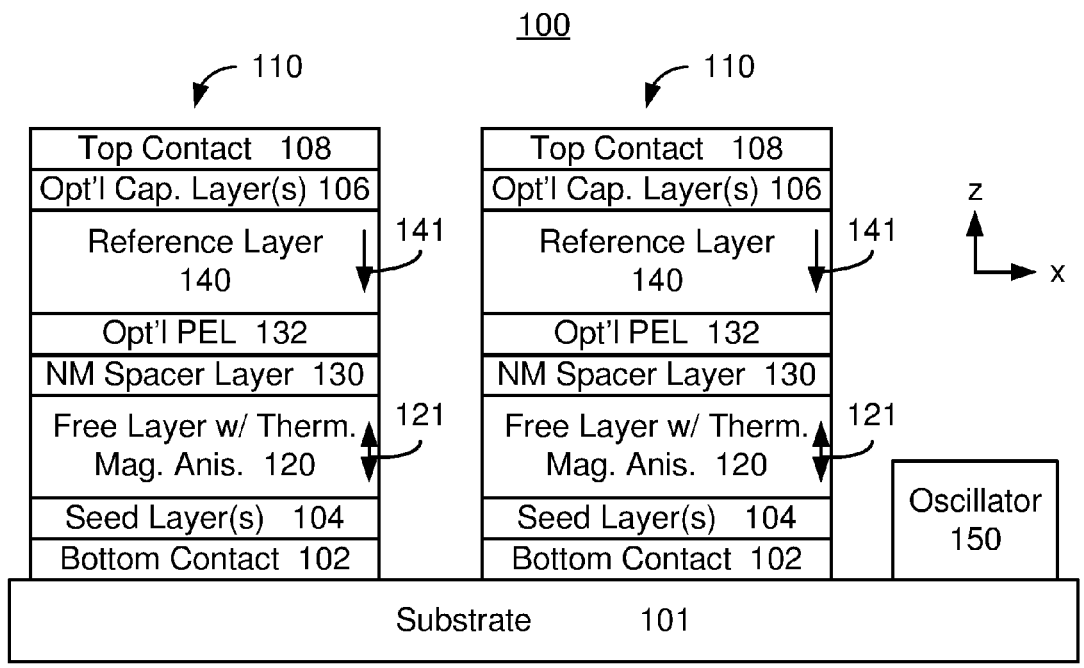
FIG. 2 depicts an exemplary embodiment of a magnetic device including magnetic junctions programmable using spin transfer and magnetic resonance.

FIG. 2 depicts an exemplary embodiment of a magnetic memory 100 including magnetic junctions 110, bit lines (not shown) and at least one magnetic oscillator 150 residing on a substrate 101. For clarity, FIG. 2 is not to scale. Although only one oscillator 150 is shown, in other embodiments, multiple oscillators might be present. The magnetic memory 100 includes multiple storage cells. Each storage cell includes one or more of the magnetic junctions 110 and may include a selection device (not shown in FIG. 2). In some embodiments, the selection device is a transistor. For the purposes of discussion, it is assumed for the purposes of discussion that one magnetic junction 110 is present per storage cell.

Each magnetic junction 110 includes a free layer 120 having a changeable magnetic moment 121, a nonmagnetic spacer layer 130 and a reference layer 140 having magnetic moment 141. The nonmagnetic spacer layer 130 is between reference layer 140 and the free layer 120. Each magnetic junction 110 is configured such that the free layer is switchable between a plurality of stable magnetic states when a write current is passed through the magnetic junction 110. Thus, the free layer 120 is programmable using spin transfer torque. The magnetic memory 100 may be a STT-RAM and, therefore, used in a variety of electronic devices. The free layer 120 has a high perpendicular magnetic anisotropy and is thermally sensitive.

Also shown in FIG. 2 is an underlying substrate 101 in which devices including but not limited to a transistor may be formed. Bottom contact 102, top contact 108, optional seed layer(s) 104 and optional capping layer(s) 106 are also shown. The contacts 102 and/or 108 may connect the magnetic junctions 110 to the bit lines (not explicitly depicted in FIG. 2). The seed layer(s) 104 may include a thin MgO seed layer. As can be seen in FIG. 2, the reference layer 140 is closer to the top (furthest from a substrate 101) of the magnetic junction 110 than the free layer 120 is. The reference layer 140 is also deposited after the free layer 120. The magnetic junction 110 is, therefore, a top pinned junction. In alternate embodiments, the magnetic junction 110 could be a dual magnetic junction or a bottom pinned junction. For a dual magnetic junction, at least an additional (bottom) nonmagnetic spacer layer (not shown in FIG. 2) and an additional (bottom) reference layer (not shown in FIG. 2) would be present between the free layer 120 and the optional seed layer(s) 104/bottom contact 102. In a bottom pinned magnetic junction, the reference layer 140 is closer to the substrate 101 than the free layer 120. An optional pinning layer (not shown) may be used to fix the magnetization (not shown) of the reference layer 140. In some embodiments, the optional pinning layer may be an AFM layer or multilayer that pins the magnetization (not shown) of the reference layer 140 by an exchange-bias interaction. However, in other embodiments, the optional pinning layer may be omitted or another structure may be used. An optional polarization enhancement layer (PEL) 132 having a high spin polarization is also shown. Magnetic or nonmagnetic insertion layers, and/or other layers may be included in the layers of the magnetic junction 110 or be considered to be separate layers that may be used in the magnetic junction 110. However, such layers are not shown for simplicity.

The nonmagnetic spacer layer 130 may be an MgO tunneling barrier layer. The MgO layer may be crystalline and have a 200 orientation for enhanced tunneling magnetoresistance (TMR). In other embodiments, the nonmagnetic spacer layer 130 may be a different tunneling barrier layer, may be a conductive layer or may have another structure.

The reference layer 140 is magnetic. The reference layer 140 may be part of a pinned structure, such as a SAF. In such embodiments, the reference layer 140 would be one of the ferromagnetic layers interleaved with nonmagnetic layer(s). The reference layer 140 may be a multilayer. Thus, the reference layer 140 layer may also include sublayers including but not limited to multiple ferromagnetic layers. The PEL 132 having a high spin polarization is provided at the portion of the reference layer 140 nearest to the nonmagnetic spacer layer 130. In other embodiments, the PEL 132 may be omitted.

The perpendicular magnetic anisotropy (PMA) energy of the reference layer 140 exceeds its out-of-plane demagnetization energy in the embodiment shown. The reference layer 140 thus has a high PMA. As used herein a high PMA is a PMA such that the PMA energy is greater than the out-of-plane demagnetization energy. Because the reference layer 140 has a high PMA, the magnetic moment 141 of the reference layer 140 may be perpendicular-to-plane. In such embodiments, a pinning layer is generally not used. For example, the reference layer 140 may include a multilayer including multiple repeats of a Co/Pt bilayer, a CoPt alloy, a CoTb alloy and/or multiple repeats of a Co/Tb bilayer. Such combinations may have a high PMA. Similarly, the reference layer 140 may include one or more of CoFeB, FeB, CoB, Fe, $Co_2FeAl$, $Co_2FeAlSi$, $Co_2MnSi$ and MnAl, which may have a high PMA. Note that as used herein CoFeB, FeB, CoB and MnAl denote alloys in which the stoichiometry is not indicated. For example, CoFeB may include $(CoFe)_{1-x}B_x$, where x is greater than or equal to zero and less than or equal to 0.5. For example, x may be at least 0.2 and not more than 0.4. Similarly, FeB may be $Fe_{1-x}B_x$, where x is greater than or equal to zero and less than or equal to 0.5. Other materials and/or structures are having a high PMA possible for the reference layer 140. In other embodiments, the magnetic moment 141 of the reference layer 140 may be in-plane.

The free layer 120 is magnetic and has a PMA energy that exceeds the out-of-plane demagnetization energy in the embodiment shown. The free layer 130 thus has a high PMA. The magnetic moment 121 of the free layer 120 may thus be oriented perpendicular-to-plane as shown in FIG. 2. The magnetic junction is also configured such that the magnetic moment 121 of the free layer 120 may be switched using a write current driven through the magnetic junction (e.g. using spin transfer). For example, the free layer 120 may include materials such as MnX, where X is selected from Ge, Ga and Al. Other analogous materials may be used. Note that a specific stoichiometry is not implied. Such materials have a high magnetic anisotropy at room temperature. For example, the PMA might correspond to a magnetic field of at least 12 Tesla (T) at room temperature. In some cases, the PMA corresponds to a magnetic field of at least 14 Tesla (T) at room temperature. In some such embodiments, the magnetic anisotropy might correspond to a magnetic field of at least 16 Tesla (T) at room temperature. In some such embodiment, the magnetic anisotropy might correspond to a magnetic field of at least 20 Tesla (T) at room temperature. In some embodiments, the PMA of the free layer 120 is sufficiently high that the free layer 120 has a ferromagnetic resonance (FMR) frequency in the THz range (e.g. at least one hundred GHz and possibly in the 1-10 THz range). As mentioned above, the magnetic anisotropy of the free layer 120 is sensitive to temperature. Thus, the magnetic anisotropy of the free layer 120 changes with temperature. Materials such as MnX exhibit such a temperature sensitive magnetic anisotropy.

During programming of the magnetic junctions 110, a write current is driven through the magnetic junction in the perpendicular-to-plane (CPP) configuration. In the embodiment shown in FIG. 2, current is driven along the z-axis. The write current passing through the magnetic junction 110 causes joule heating in the free layer 120. Consequently, the free layer 120 has a higher temperature during switching than when the free layer is quiescent or being read. Thus, the switching temperature of the free layer 120 is greater than room temperature. In some embodiments, the switching temperature of the free layer 120 is at least one hundred degrees Celsius and not more than two hundred degrees Celsius. The switching temperature for the free layer 120 may be at least one hundred and thirty degrees Celsius and not more than one hundred and eighty degrees Celsius. For example, the switching temperature may be on the order of one hundred and seventy degrees Celsius. The temperature of the free layer 120 may thus increase by on order of one hundred degrees Celsius or more during switching. However, other switching temperatures may occur for other embodiments. The switching temperature of the free layer 120 is, however, generally desired to be less than any of the anneal temperatures used during fabrication of the magnetic junction 100. Although described herein as a "switching temperature", one of ordinary skill in the art will readily recognize that the switching temperature refers to a range of temperatures at or around which the free layer 120 is programmed.

In addition, the free layer 120 reaches this switching temperature very quickly, even if the temperature change is due to joule heating only. For example, in some embodiments, the free layer 120 may reach the switching temperature within a few nanoseconds of the write current initially being driven through the magnetic junction 110. In some embodiments, the switching temperature may be reached in less than one nanosecond. For example, the switching temperature may be reached in less than one hundred picoseconds in some embodiments. The precise profile of the change in temperature of the free layer 120 may vary. However, the temperature change is desired to occur rapidly, on the order of the time scales discussed herein.

The change in temperature of the free layer 120 results in a change in the magnetic anisotropy during switching. The magnetic anisotropy of the free layer 120 may decrease by at least five percent from room temperature (quiescent/no read or write) to the switching temperature. In some embodiments, the magnetic anisotropy of the free layer 120 decreases by at least ten percent from room temperature to the switching temperature. The magnetic anisotropy of the free layer 120 may decrease by at least twenty percent from room temperature to the switching temperature in some embodiments. In some embodiments, the PMA at the switching temperature may be seventy percent of the PMA at room temperature (i.e. a thirty percent decrease). In some cases, the magnetic anisotropy of the free layer 120 decreases by not more than fifty percent from room temperature to the switching temperature.

The ferromagnetic resonance (FMR) frequency of the free layer 120 is proportional to the magnetic anisotropy. For example, a free layer 120 having a room temperature magnetic anisotropy of approximately sixteen Tesla (T) has an FMR frequency of approximately 480 GHz. The change in the magnetic anisotropy during programming due to heating of the free layer results in a change in the FMR frequency. For example, suppose the magnetic anisotropy of the free layer 120 changes by twenty percent. The FMR frequency may also change by twenty percent. In the example above, the free layer 120 may have a switching temperature anisotropy of approximately twelve Tesla (T) and an FMR frequency of 360 GHz. Thus, the magnetic junctions 110 have free layers 120 with a high, temperature sensitive magnetic anisotropy and a corresponding temperature sensitive magnetic resonance frequency. Note that the terms magnetic resonance and ferromagnetic resonance (FMR) are used interchangeably herein.

The memory 100 also includes one or more magnetic oscillators 150. The magnetic oscillator 150 has a characteristic frequency range. Stated differently, the magnetic oscillator 150 provides an oscillating magnetic signal within the characteristic frequency range. The free layer 120 and magnetic oscillator 150 are configured such that the FMR frequency of the free layer 120 at room temperature is outside of the characteristic frequency range. The free layer 120 and magnetic oscillator 150 are also configured such that the FMR frequency of the free layer 120 at the switching temperature is within the characteristic frequency range. In some embodiments, the magnetic oscillator is a CMOS push-pull oscillator with an on-chip antenna. Such a magnetic oscillator may broadcast its signal, and thus the oscillating magnetic field, across the entire memory 100. In other embodiments, the magnetic oscillator 150 may be a thin film metal grating oscillator. In such embodiments, the oscillator may have multiple layers of gratings with complementary chiral patterns. In other embodiments, the magnetic oscillator 150 may be a spin torque oscillator. Such a spin torque oscillator may be a magnetic junction analogous to the magnetic junctions 110 and coupled to a data line. However, the magnetic anisotropy of the spin torque oscillator is desired to be less than the magnetic anisotropy of the magnetic junctions 110 at room temperature. The magnetic junction functioning as the magnetic oscillator 150 provides the oscillating magnetic field with a frequency equal to the magnetic resonance frequency of the magnetic junction/oscillator 150. In such an embodiment, there may be one magnetic junction/oscillator 150 per bit line. Other and/or additional magnetic oscillator(s) 150 may be used in other embodiments.

In operation, the free layer 120 has a high magnetic anisotropy when not being programmed. Thus, the free layer 120 is magnetically stable during read operations and when the magnetic junction 110 is quiescent (not being read or programmed). During programming, a write current is driven through the magnetic junction 110. This current (or some other mechanism) rapidly heats the free layer 120 to the switching temperature. As a result, the magnetic anisotropy of the free layer 120 drops by at least the amounts described above. The magnetic moment 121 of the free layer 120 is, therefore, less thermally stable. In addition, the magnetic oscillator 150 provides an oscillating magnetic signal in its characteristic frequency range during programming. As discussed above, this frequency range may be desired to be in the THz range. For example, on the order of a few hundred GHz. Because the free layer 120 has been heated to the switching temperature and the magnetic anisotropy reduced, the magnetic resonance frequency for the free layer 120 being programmed is within the frequency range of the magnetic oscillator 150. Magnetic junctions that are not being written (write current is not being driven through) have a higher magnetic anisotropy and, therefore, a magnetic resonance frequency that is outside of the frequency range of the magnetic oscillator 150. As a result, only those magnetic junctions 110 being programmed are affected by the oscillating magnetic signal. Because the FMR frequency of the free layer 120 is close to the frequency of the magnetic oscillator 150, the magnetic moment 121 of the free layer 120 is disturbed by the signal from the magnetic oscillator 150. The magnetic moment 121 is canted from its equilibrium position. Stated differently, the magnetic moment 121 is canted from the stagnation point (the point at which the spin polarized current does not exert a torque on the magnetic moment 121). Because of the frequency of the magnetic oscillation and the speed at which the free layer 120 is heated, this occurs rapidly. In some cases in less than one nanosecond. In some such embodiments, this occurs in less than one hundred picoseconds. Because the magnetic moment 121 is canted from perpendicular-to-plane, the spin polarized write current driven through the magnetic junction 110 may more effectively switch the magnetic moment 121 to the desired direction via spin transfer torque. Thus, switching may occur more rapidly and at a lower write current.

The magnetic junction 110 may have improved performance. The free layer 120 and reference layer 140 may have their magnetic moments oriented perpendicular-to-plane, which may be desirable for improved performance. Because of the high magnetic anisotropy, the free layer 120 is thermally stable at room temperature and has an FMR frequency sufficiently different from that of the magnetic oscillator 150. Because this high magnetic anisotropy is also thermally sensitive, the magnetic anisotropy changes during programming. The high temperature magnetic anisotropy allows the FMR frequency of the free layer 120 to be in the THz range of the signal from the magnetic oscillator 150 during switching. Consequently, the magnetic oscillator 150 may be used to more rapidly and easily switch the magnetic moment of only those magnetic junctions 110 being programmed. Switching time and current may be decreased. In addition, selection of the magnetic storage cells to be written may be made by a combination of write current and oscillating magnetic signal. Consequently, performance of the magnetic junction 110 and magnetic memory 100 may be improved.

Figure 3:
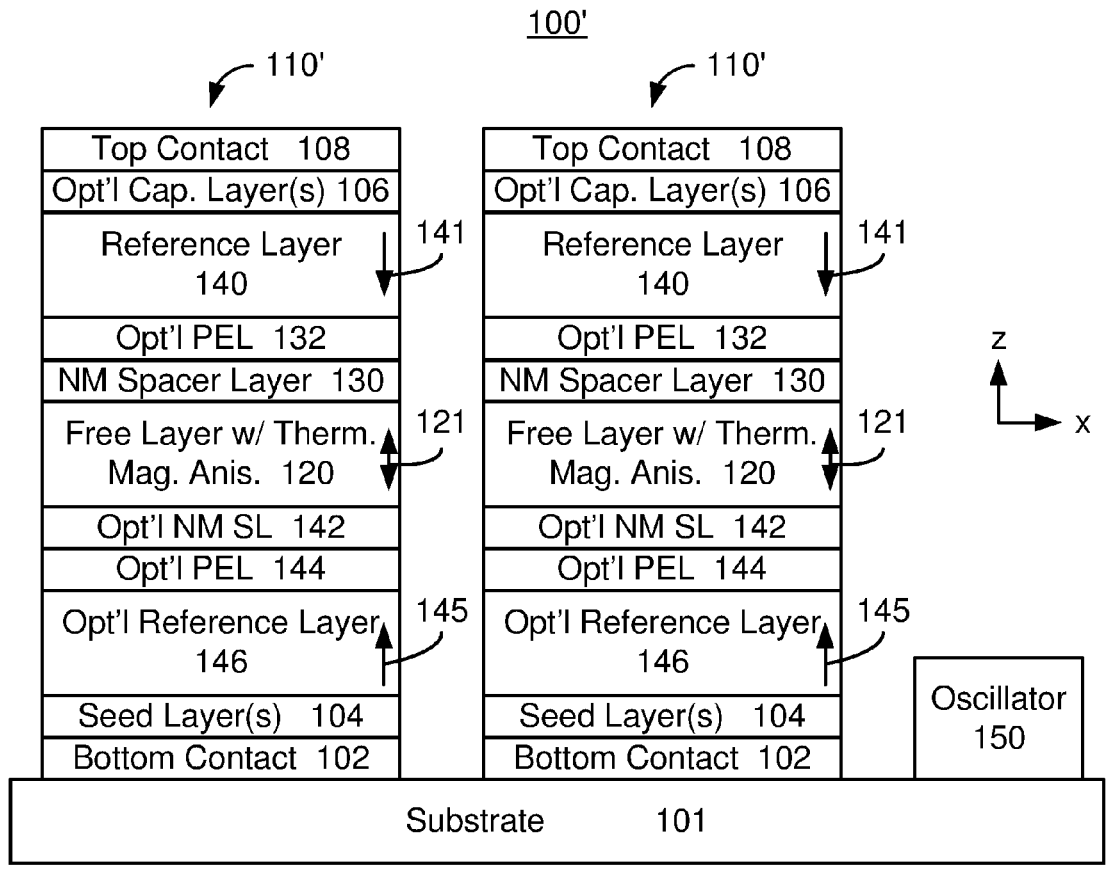
FIG. 3 depicts another exemplary embodiment of a magnetic device including magnetic junctions programmable using spin transfer and magnetic resonance.

FIG. 3 depicts another exemplary embodiment of a magnetic device 100' including magnetic junctions 110' programmable using spin transfer and magnetic resonance. For clarity, FIG. 3 is not to scale. The magnetic memory 100' is analogous to the magnetic memory 100. Similar components thus have analogous labels. The magnetic memory 100' includes magnetic junctions 110', bit lines (not shown) and magnetic oscillator 150 analogous to the magnetic junctions 110, bit lines and magnetic oscillator 150 described above with respect to the magnetic memory 100. The magnetic memory 100' also includes a substrate 101, bottom contact 102, optional seed layer(s) 104, optional capping layer(s) 106 and top contact 108 that are analogous to the substrate 101, bottom contact 102, optional seed layer(s) 104, optional capping layer(s) 106 and top contact 108, respectively, for the magnetic memory 100.

In the embodiment shown in FIG. 3, the magnetic junctions 110' are dual magnetic junctions. Thus, the magnetic junctions 110' also include nonmagnetic spacer layer 142, optional PEL 144 and reference layers 146. The nonmagnetic spacer layer 142, PEL 144 and reference layer 146 are analogous to the nonmagnetic spacer layer 130, PEL 132 and reference layer 140, respectively. In the embodiment shown, the magnetic moment 145 of reference layer 146 is antiparallel to the magnetic moment 141 of the reference layer 140. In other embodiments, other orientations of the magnetic moments 145 and 141 are possible. For example, the magnetic moments 141 and 145 might be parallel.

The magnetic memory 100' shares the benefits of the magnetic memory 100. The free layer 120 and reference layers 140 and 146 may have their magnetic moments oriented perpendicular-to-plane, which may be desirable for improved performance. Because of the high magnetic anisotropy, the free layer 120 is thermally stable at room temperature and unaffected by the magnetic oscillator 150 if the free layer 120 is not heated. Because this high magnetic anisotropy is also thermally sensitive, the magnetic anisotropy changes during programming. Consequently, the magnetic oscillator 150 may be used to more rapidly and easily switch the magnetic moment of only those magnetic junctions 110' being programmed. Switching time and current may be decreased. Consequently, performance of the magnetic junction 110' and magnetic memory 100' may be improved.

Figure 4:
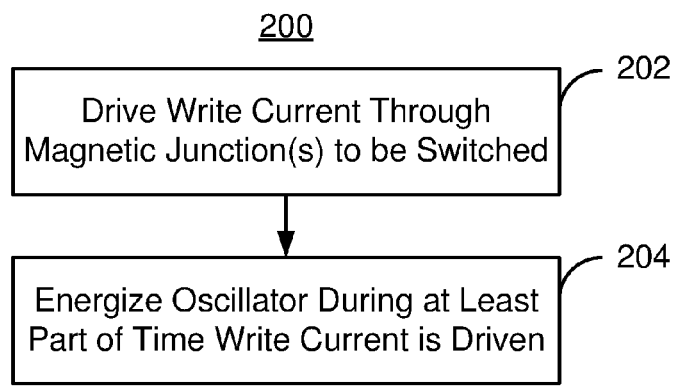
FIG. 4 is a flow chart depicting an exemplary embodiment of a method for programming a magnetic junction spin transfer torque and magnetic resonance.

FIG. 4 depicts an exemplary embodiment of a method 200 for programming a magnetic junction including a thermally sensitive free layer and usable in a magnetic device such as a spin transfer torque random access memory (STT-RAM) and, therefore, in a variety of electronic devices. For simplicity, some steps may be omitted, performed in another order, include substeps and/or combined. Further, the method 400 may start after other steps in forming a magnetic memory have been performed. For simplicity, the method 200 is described in the context of the magnetic junctions 110 and magnetic memory 100. However, other magnetic junctions and magnetic memories having analogous properties might be used.

A write current is driven through the magnetic junction 110, via step 202. Step 202 may include providing a write current pulse. Thus, the write current is not continuously driven through the magnetic junctions 110. In addition, the write current is only driven through those magnetic junctions desired to be programmed. In some embodiments, the write current pulse has a width of not more than ten nanoseconds. In some embodiments, the write current pulse has a width of not more than one nanosecond. However, other pulse widths are possible. Because the write current is driven through the magnetic junction 110, the free layer 120 is heated to the switching temperature. Thus, the magnetic anisotropy of the free layer 120 decreases in the manner described above.

While the write current is driven through the magnetic junction 110, an oscillating magnetic signal having a characteristic frequency range is provided, via step 204. In some embodiments, step 204 includes energizing the magnetic oscillator 150. Because the selection of the magnetic junction 110 being written requires both the magnetic signal and the write current (with the attendant drop in magnetic anisotropy), step 204 need not be restricted to the time during which the write current is applied. Further, step 204 need not be restricted only to the magnetic junction 110 being programmed. Instead, the magnetic oscillator 150 could be energized starting before, at the same time as, or after the write current of step 202 is initiated. Similarly, the write current of step 202 and the oscillating magnetic signal of step 204 need not be terminated at the same time. In general, oscillating magnetic signal is desired to be terminated before the write current pulse.

Using the method 200, the desired magnetic junction(s) 110 may be more rapidly and easily programmed. Thus, the benefits of the magnetic memories 100 and 100' may be achieved.

Figure 5:
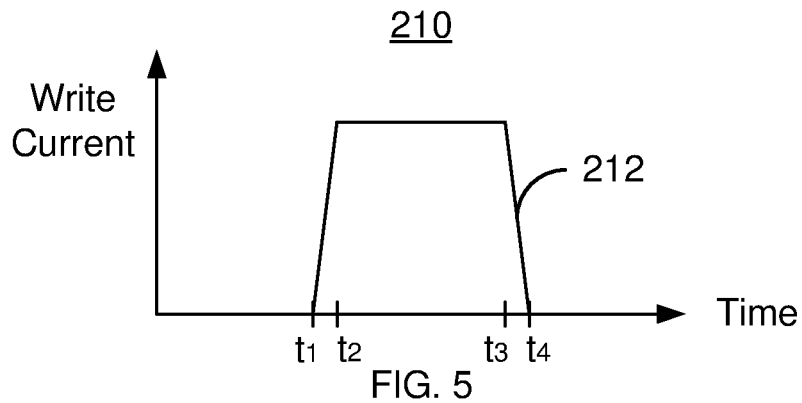
FIGS. 5-7 depicts exemplary embodiments of timing diagrams for programming a magnetic junction using spin transfer torque and magnetic resonance.
Figure 6:
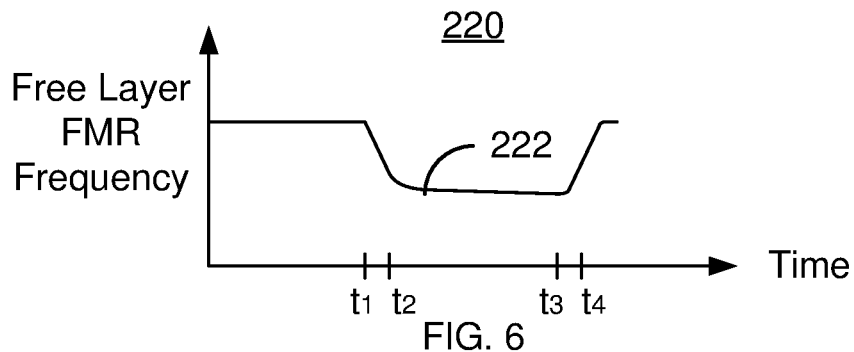
Figure 7:
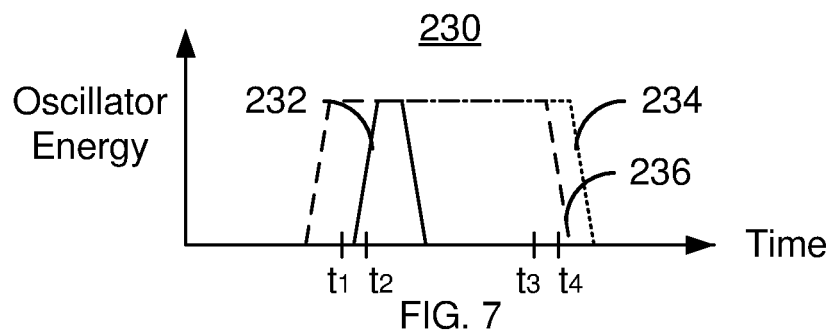
Figure 8:
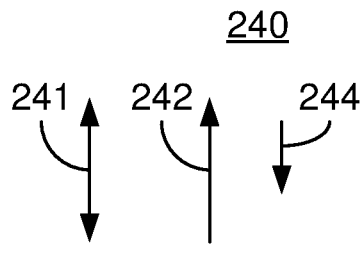
FIGS. 8-10 depict another exemplary embodiment of the magnetic moment of the free layer during programming using spin transfer torque and magnetic resonance.
Figure 9:
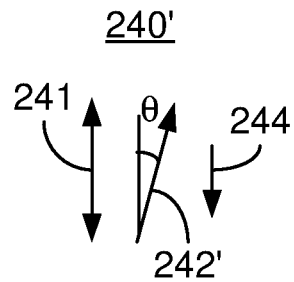
Figure 10:
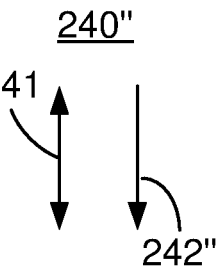

The method 200 may be more fully explained in connection with FIGS. 5-10. FIGS. 5-7 depicts exemplary embodiments of timing diagrams for programming a magnetic junction 110 using spin transfer torque and magnetic resonance in the method 200. FIGS. 8-10 depict another exemplary embodiment of the magnetic moment of the free layer during programming using spin transfer torque and magnetic resonance. For simplicity, FIGS. 5-10 are described in the context of the method 200 and magnetic memory 100. However, the discussion herein applies to other analogous methods and magnetic memories. Note that the diagrams of FIGS. 5-10 are for explanation only and are not intended to depict a particular write mechanism or memory.

FIG. 5 is a graph 210 depicting the write current 212 through selected magnetic junction(s) 110 as a function of time. Thus, the current 212 is turned on at time $t_1$, via step 202. The current is rapidly ramped up, reaching a maximum at time $t_2$. The write current remains constant until time $t_3$. The current is then ramped down, reaching zero at time $t_4$. Thus, the write current 212 is a pulse driven through selected magnetic junction(s). In other embodiments, the write current pulse may have a different shape.

FIG. 6 is a graph 220 depicting the magnetic resonance frequency 222 for the free layer 120 as a function of time. The magnetic resonance frequency 222 is intended to illustrate general trends in the magnetic resonance frequency during writing and does not represent data for a specific magnetic junction 110. The free layer 120 undergoes joule heating because of the write current. Thus, a short time after the write current 212 is turned on at time $t_1$, the temperature of the free layer 120 increases and the magnetic resonance frequency 222 decreases. The initial change in the free layer temperature and, therefore, the magnetic resonance frequency 222 is rapid. Thus, at time $t_2$, the magnetic resonance frequency 222 may be at or close to the minimum value during writing. The magnetic resonance frequency 222 remains relatively low during writing because the free layer temperature remains in the switching temperature range. After the write current begins to decrease at time $t_3$, the free layer temperature drops. Thus, the magnetic resonance frequency 222 increases. After writing has completed, the magnetic resonance frequency 222 is at its initial value. Note that the magnetic anisotropy for the free layer 120 follows an analogous curve.

FIG. 7 is a graph 230 depicting various possible energies 232, 234 and 236 provided to the magnetic oscillator 150 using step 204. The magnetic oscillator energy 232 commences after the write current has started heating the free layer 120 and terminates before the write current pulse 212. The magnetic oscillator energy 234 commences at the same time as the energy 232, but terminates after the write current pulse 212. The magnetic oscillator energy 236 starts before the write current is applied to the magnetic junction(s) 110 and terminates about the same time as the write pulse 212. In general, a magnetic oscillator energy analogous to the curve 232, which starts approximately the same time as the write current 212 and terminates while the write current 212 is still applied may be more desirable. Other start and end times for energizing the magnetic oscillator 150 may be used.

FIG. 8 depicts the magnetic moments 240 before writing commences and at the very start of the write current 212 in step 202. The magnetic moment 242 of the free layer 110 is aligned with the easy axis 241 of the free layer 110. Thermal fluctuations may allow for a small deviation in the magnetic moment 242 from the easy axis 241. However, the large free layer magnetic anisotropy results in smaller thermal deviations. Thus, the magnetic moment 242 is considered to be very well aligned with the easy axis 241.

When the write current 212 is energized in step 202 at time $t_1$, a spin polarized current 244 is produced. The direction of the spin polarized current 244 is determined by the magnetic moment 141 of the reference layer 140 and the direction of the write current 212 through the magnetic junction 110. As can be seen in FIG. 8, the spin polarized current 244 initially exerts no torque on the free layer magnetic moment 242 because they are aligned. Thus, the free layer 110 is initially at the stagnation point, where little or no spin transfer torque is exerted on the magnetic moment 242. Even if the magnetic oscillator 150 is energized at this point, the magnetic anisotropy of the free layer 120 is too high for the magnetic moment 242 to be significantly affected. However, the spin polarized current 244 does result in joule heating. Thus, the temperature of the free layer 120 increases and the magnetic anisotropy 222 decreases.

FIG. 9 depicts the magnetic moments 240' at some time after $t_2$ but before the oscillator energy 232, 234 or 236 is terminated. Thus, step 204 is being performed. The magnetic anisotropy 222 has decreased because of joule heating. As discussed above, the decrease may be at least ten percent and not more than fifty percent. In some such embodiments, the decrease in the magnetic anisotropy and magnetic resonance frequency is at least thirty percent. As shown in FIG. 6, the magnetic resonance frequency 222 has decreased in an analogous manner due to the temperature rise.

Because of the decrease in the magnetic anisotropy and magnetic resonance frequency 222, the magnetic resonance frequency 222 of the free layer 120 is in the frequency range of the magnetic oscillator 150. Consequently, the oscillating magnetic signal provided in step 204 perturbs the magnetic moment 242' away from the easy axis 241 by a small angle, θ. This can be seen in FIG. 9. As a result, the spin polarized current 244 still being driven through the magnetic junction 110 may exert a torque on the magnetic moment 242. This perturbation may happen very rapidly because the frequency of the magnetic oscillator 150 is large, for example in the range of 400 GHz to 1 THz. Thus, the perturbation shown in FIG. 9 may occur in well under one nanosecond.

Whether or not the energy 232/234/236 to the magnetic oscillator 150 is terminated, spin transfer switching due to the write current 212 continues. Because the oscillating magnetic signal perturbed the magnetic moment 242' from the easy axis 241 (away from the stagnation point), the spin transfer switching may be more efficient. Thus, as is shown in FIG. 10, the magnetic moment 242" of the free layer 120 may be switched for times greater than or equal to $t_4$.

Thus, using the method 200, the free layer 120 of the magnetic junction 110 may be rapidly programmed at lower write currents. When not being written, the free layer magnetic moment 111/242 may be thermally stable due to the high magnetic anisotropy. Thus, the benefits of the magnetic memories 100 and/or 110 may be achieved.

Figure 11:
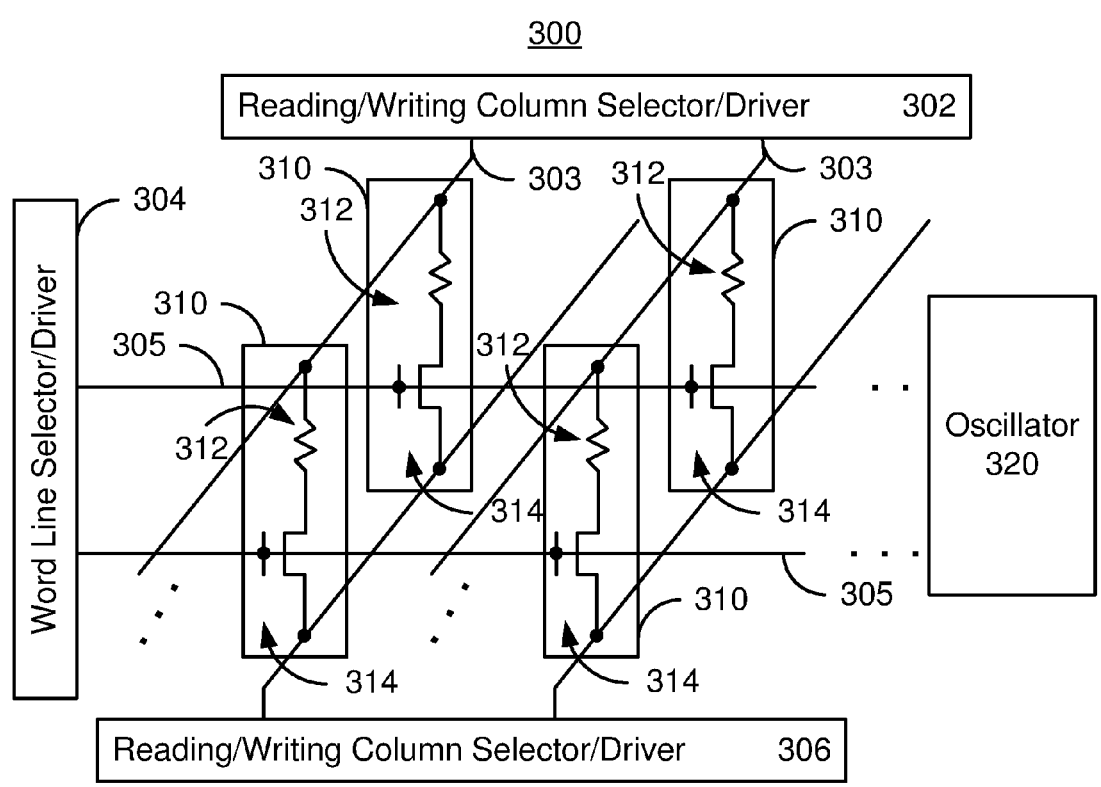
FIG. 11 depicts another exemplary embodiment of a magnetic device including magnetic junctions programmable using spin transfer and magnetic resonance.

FIG. 11 depicts an exemplary embodiment of a memory 300 that may use one or more of the magnetic memories 100 and/or 100' that are programmed by the method 200. The magnetic memory 300 includes reading/writing column select drivers 302 and 306 as well as word line select driver 304. Also shown are bit lines 303 and word lines 305. Note that other and/or different components may be provided. The storage region of the memory 300 includes magnetic storage cells 310. Each magnetic storage cell includes at least one magnetic junction 312 and at least one selection device 314. In some embodiments, the selection device 314 is a transistor. The magnetic junctions 312 may be one of the magnetic junctions 110 and/or 110' disclosed herein. Although one magnetic junction 312 is shown per cell 310, in other embodiments, another number of magnetic junctions 312 may be provided per cell. Also shown is magnetic oscillator 320 that may be used to provide the oscillating magnetic signal used during switching. As such, the magnetic memory 300 may enjoy the benefits described above.

Figure 12:
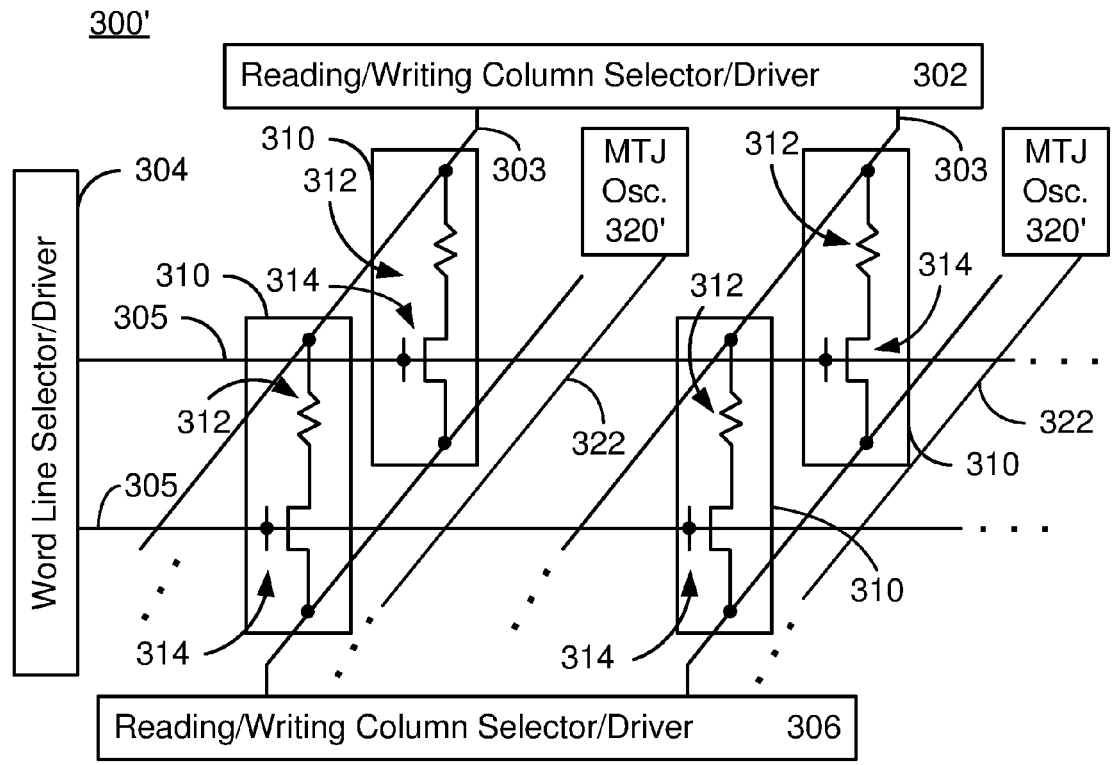
FIG. 12 depicts another exemplary embodiment of a magnetic device including magnetic junctions programmable using spin transfer and magnetic resonance.

FIG. 12 depicts an exemplary embodiment of a memory 300' that may use one or more of the magnetic memories 100 and/or 100' that are programmed by the method 200. The magnetic memory 300' is analogous to the magnetic memory 300. The magnetic memory 300' thus includes reading/writing column select drivers 302 and 306 as well as word line select driver 304. Also shown are bit lines 303 and word lines 305. Note that other and/or different components may be provided. The storage region of the memory 300 includes magnetic storage cells 310. Each magnetic storage cell includes at least one magnetic junction 312 and at least one selection device 314. In some embodiments, the selection device 314 is a transistor. The magnetic junctions 312 may be one of the magnetic junctions 110 and/or 110' disclosed herein. Although one magnetic junction 312 is shown per cell 310, in other embodiments, another number of magnetic junctions 312 may be provided per cell. Also shown is magnetic oscillator 320' that may be used to provide the oscillating magnetic signal used during switching. In the embodiment shown, the magnetic oscillator 320' is a magnetic tunneling junction (MTF) 320' connected to a data line 322. Thus, the oscillator 320' is a spin torque oscillator. As such, the magnetic memory 300' may enjoy the benefits described above.

Figure 13:
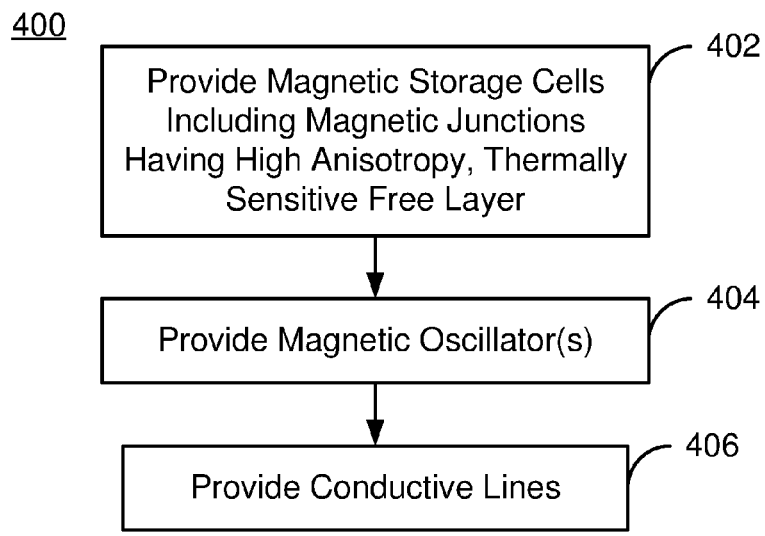
FIG. 13 is a flow chart depicting an exemplary embodiment of a method for providing a magnetic memory programmable using spin transfer torque and magnetic resonance.

FIG. 13 depicts an exemplary embodiment of a method 400 for fabricating a magnetic memory usable in a magnetic device such as a spin transfer torque random access memory (STT-RAM) and, therefore, in a variety of electronic devices. For simplicity, some steps may be omitted, performed in another order, include substep(s) and/or combined. Further, the method 400 may start after other steps in forming a magnetic memory have been performed. For simplicity, the method 400 is described in the context of the magnetic memories 100 and 100'. However, other magnetic memories may be formed.

The magnetic storage cells including the magnetic junctions 110/110' are fabricated, via step 402. Step 402 includes providing a reference layer 140, nonmagnetic spacer layer 130 and free layer 120 having the properties described herein are formed. If a dual magnetic junction 100' is to be provided, the additional nonmagnetic spacer layer 142 and the additional reference layer 146 are provided, as part of step 402. If PEL(s) 132 and 144 are to be included, then step 402 includes forming these structures. Other analogous structures, such as insertion layers, seed layer(s), capping layer(s) and/or other layers in the magnetic storage cell are fabricated as part of step 402. The edges of the each layer may be defined together. For example after deposition of the all layers of the magnetic junction, a mask covering the region of the magnetic junction 110/110' may be provided and an ion mill performed. The ion mill removes the layers of the stack between the locations of the magnetic junctions 110/110'. Alternatively, the edges of each layer may be individual defined. In addition, the selection device such as a transistor may also be fabricated as part of step 402. Other structures within the storage cells may also be formed.

The magnetic oscillator(s) 150 used in the magnetic memory 100/100' is also formed, via step 404. The conductive lines, such as bit lines 303 and lines 322 may be formed, via step 406. Fabrication of the memory 100 may then be completed.

Using the method 400, the magnetic memory 100 and/or 100' may be formed. Thus, the benefits of the magnetic memory 100 and/or 100' may be achieved.

A method and system for providing a magnetic junction and a memory fabricated using the magnetic junction has been described. The method and system have been described in accordance with the exemplary embodiments shown, and one of ordinary skill in the art will readily recognize that there could be variations to the embodiments, and any variations would be within the spirit and scope of the method and system. Accordingly, many modifications may be made by one of ordinary skill in the art without departing from the spirit and scope of the appended claims.

I claim:

1. A magnetic memory comprising:
a plurality of magnetic storage cells, each of the plurality of magnetic storage cells including at least one magnetic junction, the at least one magnetic junction including a free layer, a nonmagnetic spacer layer and a reference layer, the nonmagnetic spacer layer residing between reference layer and the free layer, the at least one magnetic junction being configured such that the free layer is switchable between a plurality of stable magnetic states when a write current is passed through the magnetic junction, the free layer having a first magnetic anisotropy at room temperature and a second magnetic anisotropy at a minimum switching temperature due to at least the write current, the second magnetic anisotropy being not more than ninety percent of the first magnetic anisotropy, the first magnetic anisotropy corresponding to a first ferromagnetic resonance (FMR) frequency, the second magnetic anisotropy corresponding to a second FMR frequency;
at least one magnetic oscillator having a characteristic frequency range, the first FMR frequency being outside of the characteristic frequency range, the second FMR frequency being within the characteristic frequency range; and
a plurality of bit lines coupled with the plurality of magnetic storage cells.

2. The magnetic memory of claim 1 wherein the second magnetic anisotropy is not more than eighty percent of the first anisotropy.

3. The magnetic memory of claim 2 wherein the second magnetic anisotropy is not less than fifty percent of the first magnetic anisotropy.

4. The magnetic memory of claim 1 wherein the free layer includes MnX, where X is selected from Ge, Ga and Al.

5. The magnetic memory of claim 1 wherein the first magnetic anisotropy is at least 12 Tesla.

6. The magnetic memory of claim 5 wherein the first magnetic anisotropy is at least 14 Tesla.

7. The magnetic memory of claim 6 wherein the first magnetic anisotropy is at least 20 Tesla.

8. The magnetic memory of claim 1 wherein a temperature of the free layer changes from room temperature to the minimum switching temperature in less than one nanosecond.

9. The magnetic memory of claim 1 wherein the first magnetic anisotropy is a first perpendicular magnetic anisotropy (PMA) and the second magnetic anisotropy is a second PMA.

10. The magnetic memory of claim 1 wherein the at least one magnetic oscillator is selected from at least one on-chip antenna oscillator, at least one metal grating oscillator and at least one spin torque oscillator having an oscillator magnetic anisotropy that is less than the first magnetic anisotropy and that is coupled with a data line.

11. The magnetic memory of claim 1 wherein each of the at least one magnetic junction further includes:
an additional nonmagnetic spacer layer, the free layer being between the additional nonmagnetic spacer layer and the nonmagnetic spacer layer; and an additional pinned layer, the additional nonmagnetic spacer layer being between the free layer and the additional pinned layer.

12. A method for programming a magnetic junction including a free layer, a nonmagnetic spacer layer and a reference layer, the nonmagnetic spacer layer residing between reference layer and the free layer, the magnetic junction being configured such that the free layer is switchable between a plurality of stable magnetic states when a write current is passed through the magnetic junction, the method comprising:
   driving the write current through the magnetic junction, the free layer having a first magnetic anisotropy at room temperature and a second magnetic anisotropy at a minimum switching temperature due to at least the write current, the second magnetic anisotropy being not more than ninety percent of the first magnetic anisotropy, the first magnetic anisotropy corresponding to a first ferromagnetic resonance (FMR) frequency, the second magnetic anisotropy corresponding to a second FMR frequency; and
   while the write current is driven through the magnetic junction, providing an oscillating magnetic signal having a characteristic frequency range, the first FMR frequency being outside of the characteristic frequency range, the second FMR frequency being within the characteristic frequency range, such that the free layer is programmed by excitation of an angle by the oscillating magnetic signal and spin transfer torque from the write current.

13. The method of claim 12 wherein the free layer includes MnX, where X is selected from Ge, Ga and Al.

14. The method of claim 12 wherein the first magnetic anisotropy is at least 14 Tesla.

15. The method of claim 12 wherein a temperature of the free layer changes from room temperature to the minimum switching temperature due to the write current in less than one nanosecond.

16. The method of claim 12 wherein the write current has a write current pulse length of not more than ten nanoseconds.

17. A method for providing magnetic memory comprising:
   providing a plurality of magnetic storage cells, each of the plurality of magnetic storage cells including at least one magnetic junction, the at least one magnetic junction including a free layer, a nonmagnetic spacer layer and a reference layer, the nonmagnetic spacer layer residing between reference layer and the free layer, the at least one magnetic junction being configured such that the free layer is switchable between a plurality of stable magnetic states when a write current is passed through the magnetic junction, the free layer having a first magnetic anisotropy at room temperature and a second magnetic anisotropy at a minimum switching temperature due to at least the write current, the second magnetic anisotropy being not more than ninety percent of the first magnetic anisotropy, the first magnetic anisotropy corresponding to a first ferromagnetic resonance (FMR) frequency, the second magnetic anisotropy corresponding to a second FMR frequency;
   providing at least one magnetic oscillator having a characteristic frequency range, the first FMR frequency being outside of the characteristic frequency range, the second FMR frequency being within the characteristic frequency range; and
   providing a plurality of bit lines coupled with the plurality of magnetic storage cells.

* * * * *